(12) United States Patent
Chu et al.

(10) Patent No.: US 7,085,667 B2
(45) Date of Patent: Aug. 1, 2006

(54) SYSTEM AND METHOD OF HEATING UP A SEMICONDUCTOR DEVICE IN A STANDARD TEST ENVIRONMENT

(75) Inventors: Steven Sui Hung Chu, Milpitas, CA (US); Wen-Ong Wu, Hsinchu (TW); Chee Tong Lau, Taoyuen (TW)

(73) Assignee: Analog Microelectronics, Inc., Santa Clara, CA (US)

( * ) Notice: Subject to any disclaimer, the term of this patent is extended or adjusted under 35 U.S.C. 154(b) by 74 days.

(21) Appl. No.: 10/441,762

(22) Filed: May 19, 2003

(65) Prior Publication Data

US 2004/0236530 A1  Nov. 25, 2004

(51) Int. Cl.
*G01R 27/28* (2006.01)
(52) U.S. Cl. ...................... 702/117; 324/752
(58) Field of Classification Search .............. 702/17, 702/30, 4, 84, 127, 135, 189, 42, 117, 34, 702/119, 120, 130, 132, 136; 324/752, 760, 324/754, 378, 158.1; 29/832; 720/30, 34, 720/84, 127, 135, 189, 42, 117; 257/84; 73/118.1, 7; 327/512, 513; 347/14, 60; 700/117, 34, 42, 135, 189, 84, 127, 30, 119, 700/120, 130, 132, 136
See application file for complete search history.

(56) References Cited

U.S. PATENT DOCUMENTS

| | | | | |
|---|---|---|---|---|
| 4,412,235 | A | * | 10/1983 | Bois ............................ 257/84 |
| 6,066,956 | A | * | 5/2000 | Nikawa ...................... 324/752 |
| 6,559,667 | B1 | * | 5/2003 | Tarter ......................... 324/760 |
| 2001/0049875 | A1 | * | 12/2001 | Watanabe et al. ............. 29/832 |
| 2003/0228721 | A1 | * | 12/2003 | Efland et al. ............... 438/140 |

* cited by examiner

*Primary Examiner*—Michael Nghiem
*Assistant Examiner*—Xiuqin Sun
(74) *Attorney, Agent, or Firm*—Bever, Hoffman & Harms, LLP; Jeanette S. Harms

(57) ABSTRACT

Methods of efficiently and accurately heating a semiconductor device in a standard (i.e. room temperature) handler are provided. In one embodiment, an infrared light source can be focused on the device to heat its chip. In another embodiment, the substrate diode in the device can be forward biased to heat the chip. Advantageously, the forward voltage of the substrate diode has a direct relationship with chip temperature. This relationship can be determined based on a characterization of an exemplary device type. Therefore, measuring the forward voltage can provide an accurate derivation of chip temperature. Heating of the device using a focused light source or substrate diode can be done immediately prior to testing, thereby providing an extremely time efficient way to test the device under high temperature conditions.

11 Claims, 6 Drawing Sheets

SYSTEM AND METHOD OF HEATING UP A SEMICONDUCTOR DEVICE IN A STANDARD TEST ENVIRONMENT

BACKGROUND OF THE INVENTION

1. Field of the Invention

The present invention relates to the efficient heating of a device under test (DUT) without heating its environment, thereby allowing high temperature testing of the DUT in a conventional test handler.

2. Related Art

In a conventional semiconductor device, a package is formed around a chip. This package protects the chip and provides electrical leads, called pins, which can connect to bonding pads of the chip. During subsequent system integration, these pins can then be connected to portions of a printed circuit board.

The goal of semiconductor fabrication and packaging is to provide a device that can perform to specific parameters. Therefore, to ensure that a semiconductor device can operate properly before being integrated into a system, the semiconductor device is typically tested to verify its electrical and functional properties. A computer-controlled tester and a handler, typically performs these tests.

Specifications for many semiconductor devices can also include maximum operating temperatures. Unfortunately, high temperature testing currently requires an expensive isolation chamber within a handler where the semiconductor device can be heated, maintained at that temperature, and then tested. Typically, the heat transfer can be achieved by using a heating element in or forcing heated airflow through the isolation chamber. To ensure accurate testing, the temperature in the isolation chamber can be maintained at (or slightly above) a predetermined temperature. This high temperature isolation chamber is in addition to the handler, thereby significantly increasing testing costs.

To ensure a high temperature environment for the semiconductor device, certain components of the handler must also be placed inside the isolation chamber. Such components include the tracks for moving the semiconductor devices between staging trays as well as a clamping mechanism that secures and makes electrical contact with the leads of the semiconductor devices during testing. Because such components are placed in the same hostile environment as the semiconductor device, these components are more prone to failure, thereby further increasing the testing costs.

For these reasons, high temperature testing is generally not performed during the commercial production of standard semiconductor devices. In these cases, such devices are not guaranteed to pass temperature testing, although based on the particular fabrication and packaging processes used, most standard devices typically do pass. Semiconductor devices that have guaranteed specifications regarding temperature testing, e.g. thermometer chips or over-temperature sensors, are usually sold at a significantly higher price to offset the cost of the temperature testing.

However, increasingly more applications for semiconductor devices in, for example, laptops, notepads, etc. must withstand considerable heat for longer periods of time, thereby necessitating high temperature testing of such semiconductor devices. Therefore, a need arises for a high temperature testing technique that can be used with current non-temperature regulated test equipment.

SUMMARY OF THE INVENTION

High temperature testing of semiconductor devices currently requires an expensive isolation chamber where the devices can be slowly brought to the desired temperature. This technique is time consuming, which undesirably increases testing cost. Moreover, any test equipment components inside the isolation chamber are more prone to failure because of their exposure to the high temperatures.

Therefore, in accordance with a feature of the invention, methods of efficiently and accurately heating a semiconductor device in a standard (i.e. room temperature) handler are provided. In one embodiment, a light source can be focused on the device to heat its chip. This light source could be, for example, an infrared light source. The power associated with the radiation of the light source is converted into heat, thereby creating a localized heating of the semiconductor device without heating any adjacent components. At this point, the semiconductor device can be heated to a predetermined temperature for testing.

In another embodiment, a substrate diode in the semiconductor device can be forward biased with a small current to develop a voltage between the cathode and anode. Advantageously, the forward voltage of the substrate diode has a direct relationship with chip temperature. This relationship can be determined based on a characterization of an exemplary device type in an isolated temperature chamber. Therefore, measuring the forward voltage can provide an accurate derivation of chip temperature.

In this embodiment, to provide the forward bias, a relatively large current can be applied to the anode of the substrate diode. That current quickly heats the device past a predetermined temperature. Then, the large current can be replaced with a second nominal current to maintain the forward bias. In this state, a forward voltage of the substrate diode can be monitored until the predetermined temperature is reached. At this point, the device can be tested at the predetermined temperature. In one embodiment, heating of the device, whether using a focused light source or substrate diode, can be done immediately prior to testing, thereby providing an extremely time efficient way to test the device under high temperature conditions.

In one embodiment, monitoring the forward voltage of the substrate diode includes receiving a characterization that correlates the predetermined forward voltage to the predetermined temperature. This characterization can be performed on an exemplary device the same type as the semiconductor device to be tested in handler. Thus, this characterization need only be done once for that type of semiconductor device.

A system for testing a device under high temperature conditions is also provided. The system can include a room temperature handler and a tester. In one embodiment, the room temperature handler can include a clamping mechanism as well as means for transporting the device to and from the clamping mechanism and the tester can include the means for generating the high temperature conditions with substrate diodes, wherein the high temperature conditions are advantageously localized to the device and not to other handler components, e.g. the clamping mechanism and the means for transporting. In one embodiment, the means for generating the high temperature conditions can include computer code to drive the tester resources to forward bias a substrate diode in the device. In this technique, the tester software, rather than the handler hardware needs to be modified.

The software, which is computer-readable, can include code for providing a forward bias to a substrate diode in the heated device using a nominal current, code for monitoring a forward voltage of the substrate diode until a predetermined forward Voltage is reached, and code for testing the device at the predetermined voltage, wherein the predetermined voltage indicates a desired temperature for testing. In one embodiment, the code for monitoring the forward voltage includes code for receiving a characterization data that correlates the predetermined forward voltage to the predetermined temperature.

DETAILED DESCRIPTION OF THE FIGURES

In accordance with one feature of the invention, a semiconductor device can be temperature tested without use of an isolation chamber, thereby eliminating the equipment expense as well as the long time period associated with heating up the chamber and the device. In one embodiment, applying a narrowly focused high intensity light to the semiconductor device provides an extremely effective generation of heat that is localized to the semiconductor device. In another embodiment, a substrate diode of the semiconductor device can be forward biased using a relatively large current, thereby heating up the device in a very short time period.

HIGH INTENSITY LIGHT SOURCE EMBODIMENT

Figure 1:
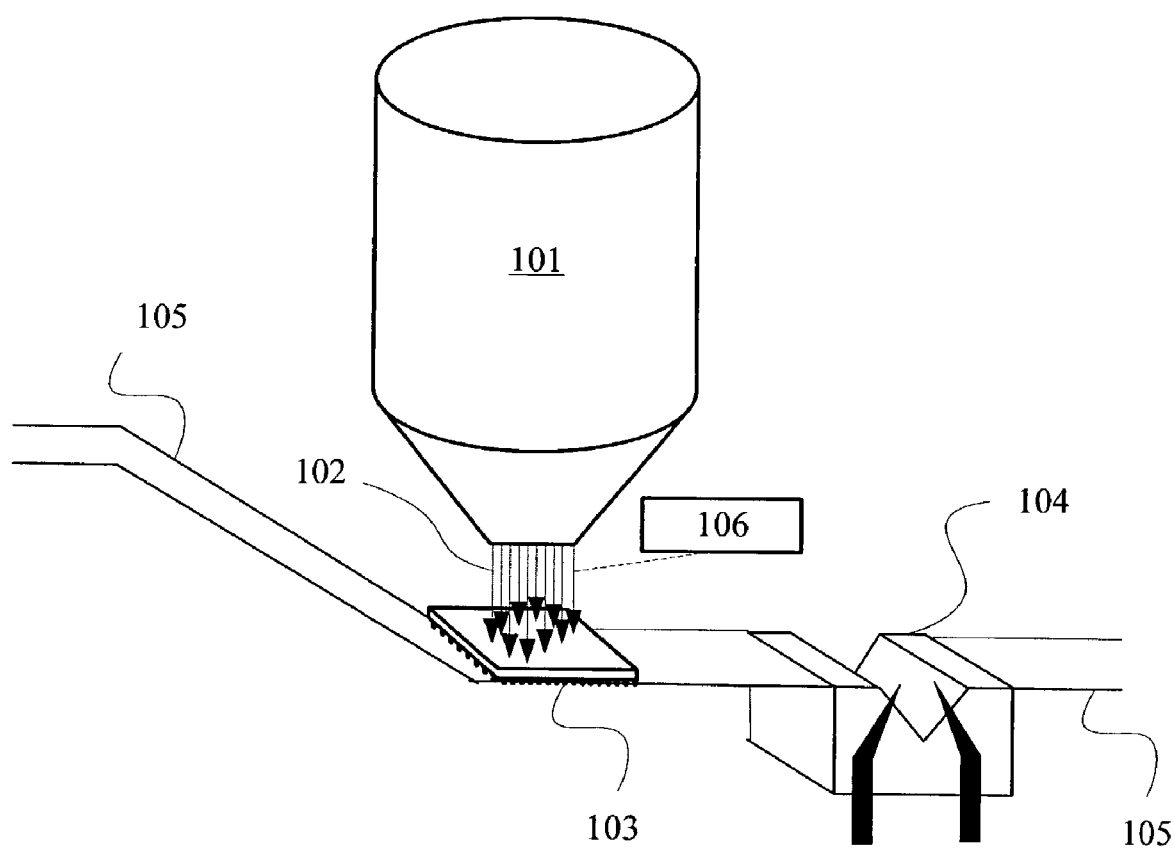
FIG. 1 illustrates one technique for heating a semiconductor device in a localized manner. This technique includes a light-emitting source having a short wavelength that can focus its light beam onto the small surface of the semiconductor device, thereby heating the semiconductor device, but not its environment.

In accordance with one embodiment of the invention shown in FIG. 1, an infrared lamp 101 (or any light-emitting source having a short wavelength) can focus its beam 102 onto the surface of a semiconductor device 103. This light energy can be converted to heat energy on the surface of semiconductor device 103. For example, a Model 4150, SpotIR™ heat source fitted with a focusing cone, provided by Research, Inc., can direct its infrared energy onto a small, circular spot approximately 0.25 inches in diameter. This model can quickly heat a target up to 800° F. within 9 seconds of a cold start.

By varying the energy of the light source, semiconductor device 103 can be heated to any predetermined high temperature. In one embodiment, a non-contact infrared temperature sensor 106 can provide an inferred temperature of semiconductor device 103 based on beam 102. The energy of infrared lamp 101 can effectively heats the device to 180° F. in 2.5 seconds after the lamp is on, whereas the heat dissipation in semiconductor device 103 generally takes 10 seconds after the lamp is off. However, a full test of the semiconductor device would generally take only few hundred milliseconds.

Therefore, this spot heating technique can be advantageously added to current handlers with minimum cost yet provide maximum efficiency. In one embodiment, the spot heating source can be positioned above the portion of a track 105 immediately preceding a clamping mechanism 104 of the handler.

SELF-HEATING EMBODIMENT

The vast majority of semiconductor devices are constructed on a silicon substrate that has been "doped" with various chemicals so as to change its conductive properties. There are two basic types of dopants: a dopant that creates "n" type regions and another dopant that creates "p" type regions. The n type regions have an excess of electrons in the conduction band, whereas p type regions have an excess of holes (i.e. the absence of electrons in a normally occupied electron orbital) in the valance band of the silicon.

Figure 2:
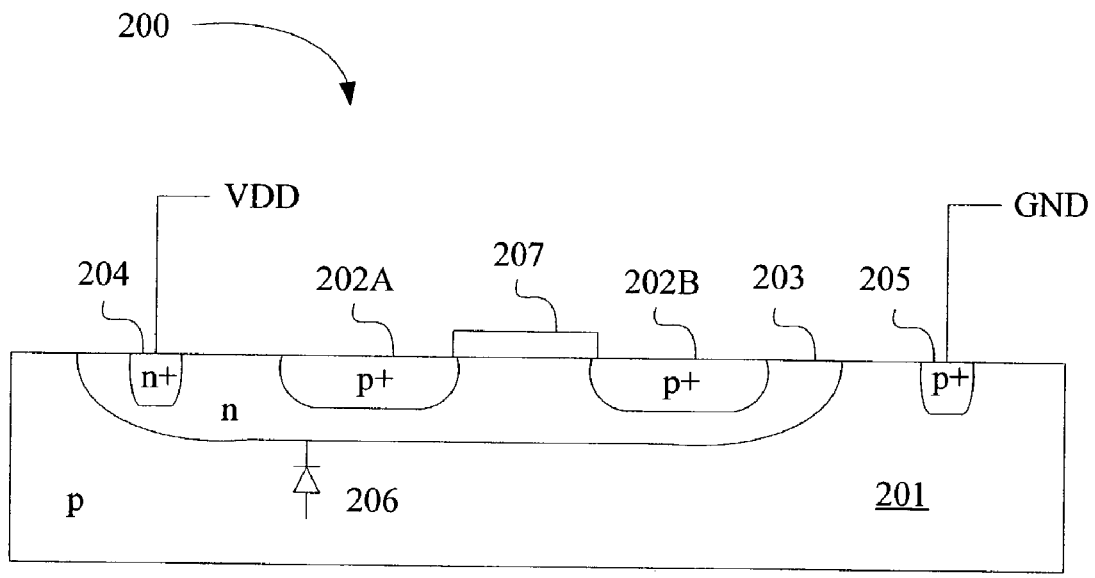
FIG. 2 illustrates a standard cross section of a PMOS transistor formed in a silicon substrate. The substrate diode, which is currently considered an undesirable byproduct of transistor formation, can be advantageously used in one embodiment of the invention to generate localized heating conditions in the semiconductor device.

FIG. 2 illustrates a standard cross section of a PMOS transistor 200 formed in silicon substrate 201 using doping. Specifically, PMOS transistor 200 includes a gate 207 and two p type regions 202A and 202B, which respectively form the source and drain of transistor 200. Regions 202A/202B are formed in an n type well 203, which in turn is formed in p type substrate 201. Regions 204 (n type) and 205 (p type) can be respectively coupled to a first supply voltage (e.g. VDD) and a second supply voltage (e.g. GND).

When p and n type regions physically touch, they form a "pn" junction. For example, in transistor 200, pn junctions are formed between regions 202A/202B and well 203 (which is integral to the functioning of transistor 200) as well as between substrate 201 and well 203 (which forms an undesirable, but unavoidable, parasitic diode). A pn junction makes a rectifying diode whose forward voltage drop at nominal currents is approximately 0.6 V.

In normal operation, the large pn diode formed by substrate 201 and well 203, i.e. substrate diode 206, is usually reverse biased. In a reverse biased state, substrate diode 206 has voltage potentials such that the n side of the junction (i.e. the cathode) is at a higher potential than the p side (i.e. the anode), thereby allowing very little current to flow through substrate diode 206. In this manner, substrate diode 206 does not interfere with the normal operation of transistor 200.

However, if the potentials across the pn junction are reversed so that substrate diode 206 is forward biased (i.e. the anode is at a higher potential than the cathode), then large currents can flow through the junction. In fact, the relationship between voltage and current in a forward biased diode is exponential. Moreover, of importance, the voltage drop across substrate diode 206 is a very strong (i.e. a predictable) function of temperature.

Therefore, in accordance with one embodiment of the invention, substrate diode 206 can be forward biased in different degrees before testing. Specifically, a relatively large current can be applied to the anode of substrate diode 206 to quickly heat the semiconductor device. Thereafter, a relatively small current can be applied to the anode to maintain a forward bias while the forward voltage of the substrate diode is being monitored.

Figure 3:
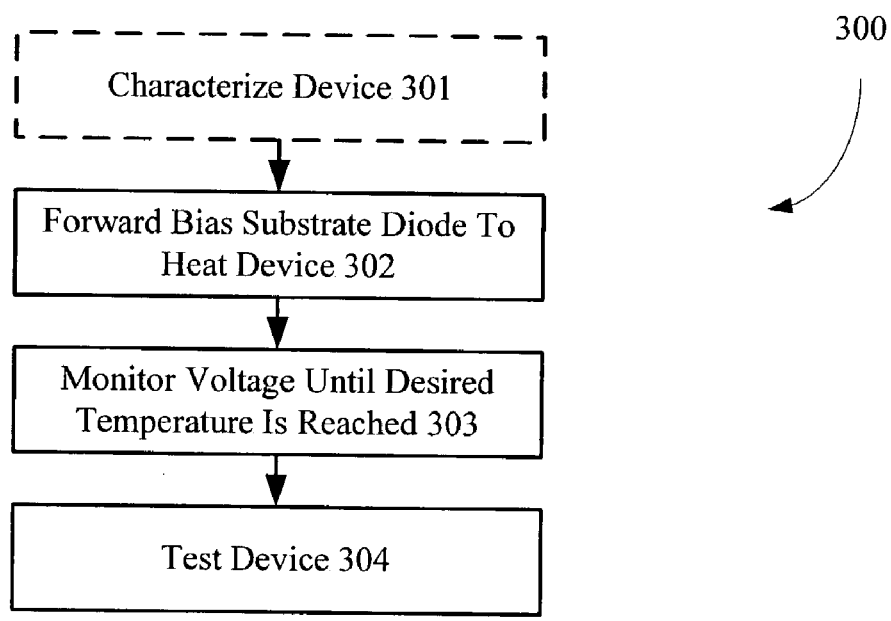
FIG. 3 illustrates a process in which a semiconductor device can be self-heated during test.

FIG. 3 illustrates a process 300 in which a semiconductor device can be self-heated during test. In step 301, an exemplary semiconductor device must be characterized so that its forward voltage (Vf) under different temperatures at small currents (i.e. 100 µA) is well defined. In step 302, the substrate diode of a device under test (DUT) (which is the same type of semiconductor device as the characterized semiconductor device) can be forward biased using a large current. This large current results in significant heat being generated within the DUT.

Specifically, the large current dropping across the substrate diode will start to dissipate power in the semiconductor device according to the relation $P=I \times Vf$, wherein I is the forced current. In one embodiment, forward voltage Vf additionally includes the resistive voltage drop due to parasitic resistances in the silicon and the other conductive packaging materials. The power dissipated in the DUT will cause the silicon chip to quickly heat up. For example, in small packages SOT-23, the chip temperature can reach over 150° C. in few seconds.

In one embodiment 302, a large relatively current at 1.5 A can be applied to the substrate diode for a predetermined time to heat the DUT to a temperature higher than the desired temperature. This predetermined time can be found empirically, i.e. through experiment, or calculated by knowing the thermal properties of the DUT and the amount of the applied current.

In step 303, the relatively large current can be replaced with a relatively small current, thereby maintaining the forward bias, but allowing the semiconductor device to cool. At this point, the forward voltage Vf can be monitored until the desired forward voltage, and thus desired temperature, is reached. Once the desired temperature is reached, the semiconductor device is ready to test in step 304.

Figure 4A:
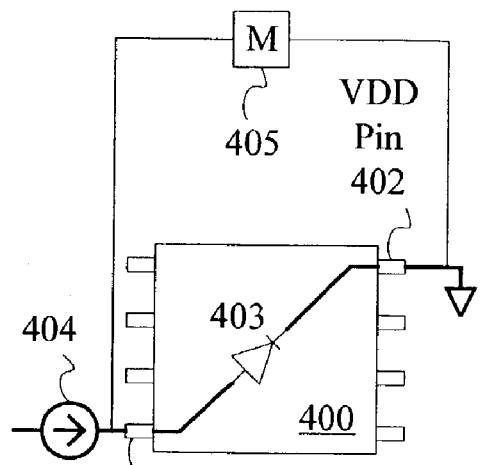
FIG. 4A illustrates an exemplary semiconductor device that includes a substrate diode coupled to a relatively small current source, thereby creating a forward bias voltage.

FIG. 4A illustrates an exemplary semiconductor device 400 that includes a substrate diode 403 having a forward bias. Specifically, in this embodiment, a small current 404 (e.g. 100 µA) can be provided to a ground pin 401. Additionally, a positive voltage supply (VDD) pin 402 can be coupled to ground. In this configuration, the anode of substrate diode 403 has a higher potential than its cathode, thereby resulting in the forward bias state. At this point, semiconductor device 400 can be placed in an oven. Then, a measuring device 405 can record the voltage difference (i.e. the forward voltage) between ground pin 401 and power supply pin 402 as the temperature of the oven increases. Of importance, this characterization need only be done once for a particular type of device. In other words, different devices of the same type have substantially the same forward voltage versus temperature characterization.

Figure 4B:
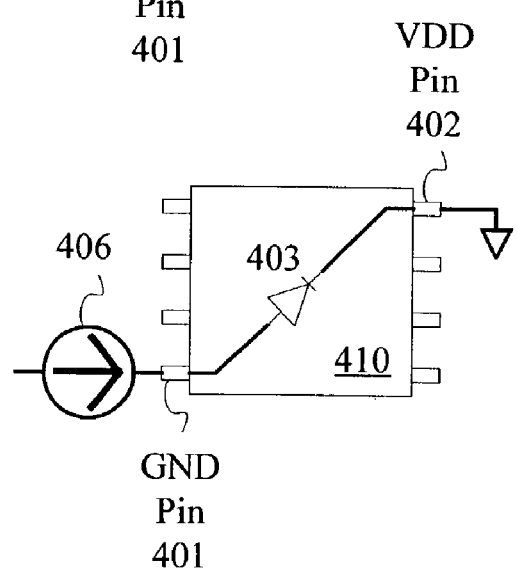
FIG. 4B illustrates an exemplary device under test (DUT) that includes a substrate diode coupled to a relatively large current source, thereby heating the DUT.

FIG. 4B illustrates an exemplary DUT 410 that is the same type of semiconductor device as device 400 (FIG. 4A). Therefore, DUT 410 includes the same pins, e.g. ground pin 401 and power supply pin 402, and substrate diode 403 (which now has known characteristics). To forward bias substrate diode 403 in DUT 410 and simultaneously heat DUT 410, a large current 406 is applied to ground pin 401, whereas positive voltage supply (VDD) pin 402 can be coupled to ground. In this state, ground pin 401 will have a much higher potential than power supply pin 402, thereby creating the forward bias state and heating DUT 410.

Once a predetermined time has elapsed to ensure that DUT 410 is heated above the desired temperature, large current 406 can be switched to a relatively small current. In one embodiment, the value of the small current can be the same amount as that used to characterize the temperature response of substrate diode 403 (e.g. 100 µA). Thus, DUT 410 can be biased in a manner shown in FIG. 4A. In this biased state, DUT 410 will start to cool immediately.

At this point, the forward voltage of DUT 410 can be monitored until the target forward voltage corresponding to the desired temperature is reached. Then, DUT 410 is ready for testing.

Figure 4C:
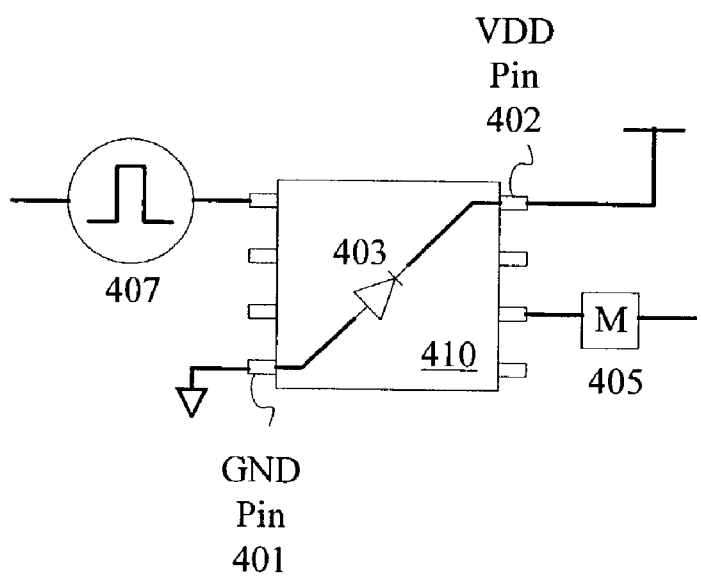
FIG. 4C illustrates an exemplary configuration of a DUT during normal test conditions. Note that the substrate diode is now reverse biased.

During testing, the small current (e.g. 100 µA) can be removed and DUT 410 can be tested using standard voltages and/or currents. FIG. 4C illustrates an exemplary configuration of DUT 410 during test, wherein a predetermined input pin can receive an input signal 407 and measuring device 405 can measure a resulting output on another pin. Note that ground pin 401 and voltage supply pin 402 are now configured to reverse bias substrate diode 403. That is, ground pin 401 now has a potential lower than voltage supply pin 402.

Note that because DUT 410 is continuously cooling, the shorter the "normal" test time, the more accurate the temperature reading. Fortunately, in many semiconductor devices, the time constant of the DUT cooling is significantly longer than the normal test time.

Note that the heat cycle and the cool cycle for each type of semiconductor device may vary. Additionally, these cycles can also be affected by mechanical components of the handler, such as contactor of handler. In one embodiment, information regarding the heat and cool cycles can be obtained during the characterization of the semiconductor device with handler.

Figure 5:
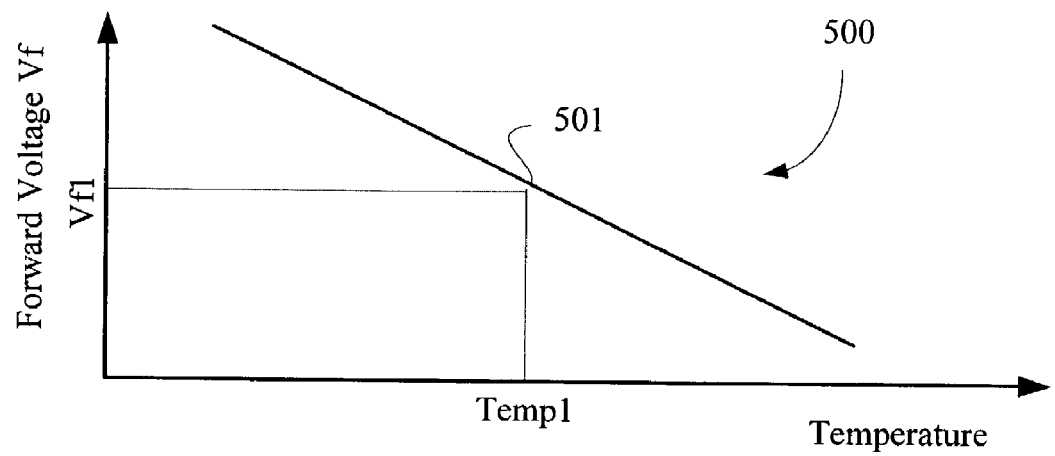
FIG. 5 illustrates an exemplary forward voltage versus temperature characterization.

FIG. 5 illustrates an exemplary forward voltage versus temperature characterization. Specifically, in graph 500, the forward voltage Vf (i.e. the voltage difference between the ground pin and the power supply pin) shows a linear relationship to the temperature. In one embodiment, for every increase in degree Celsius, the forward voltage Vf decreases by 2 mV. Of importance, the forward voltage Vf can be measured when the oven temperature reaches the desired testing temperature Temp1 at point 501. The corresponding forward voltage Vf1 can be stored for subsequent production testing. In other words, the temperature is measured indirectly by monitoring the forward voltage of the substrate diode.

Figure 6A:
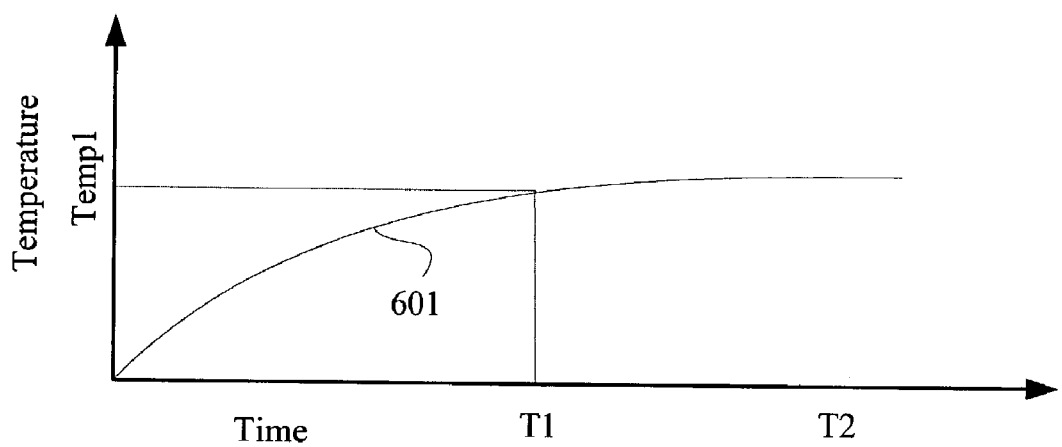
FIG. 6A illustrates an exemplary curve that indicates a typical relationship between temperature of the DUT and time during self-heating.

FIG. 6A illustrates an exemplary curve 601 that indicates a typical relationship between temperature of the DUT and time during self-heating. Temp1 indicates the target temperature for testing, which occurs at time T1. Time T2 indicates an exemplary predetermined time. Note that time T2 is merely provided to ensure that the chip temperature is greater than the target temperature Temp1.

Figure 6B:
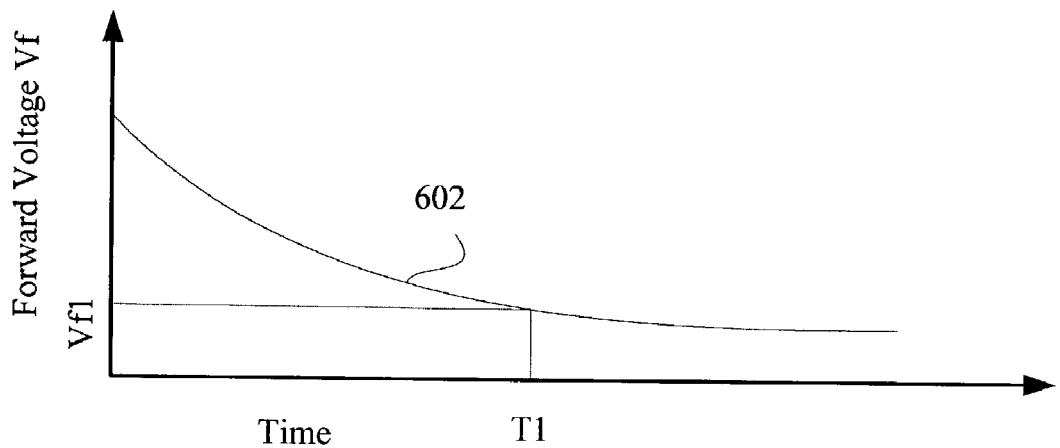
FIG. 6B illustrates an exemplary curve that indicates a typical relationship between forward voltage Vf and time after self-heating.

FIG. 6B illustrates an exemplary curve 602 that indicates a typical relationship between forward voltage Vf and time after self-heating. Note that the forward voltage Vf decreases over time until it reaches a predetermined forward voltage, which is lower than the target forward voltage Vf1.

Figure 7A:
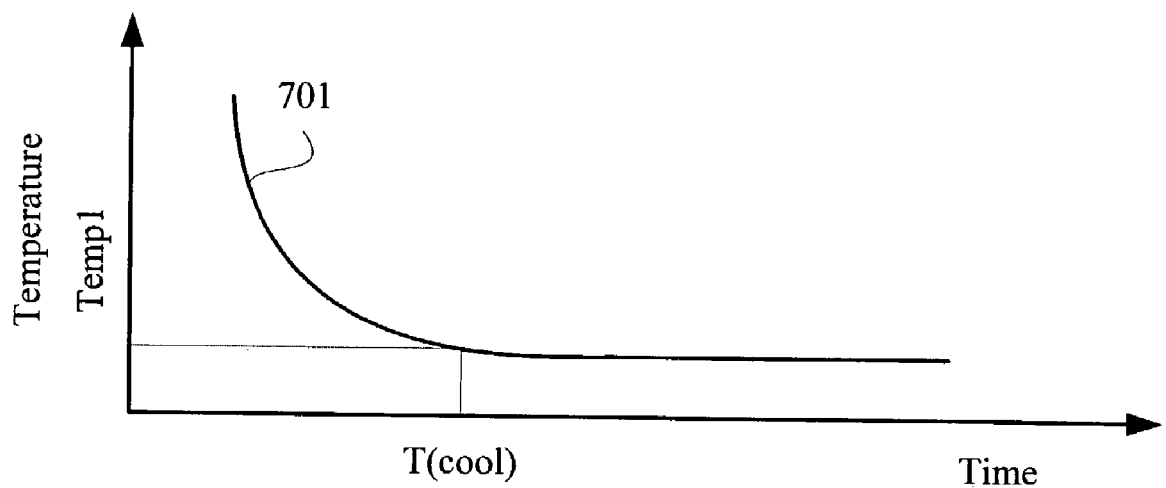
FIG. 7A illustrates an exemplary curve that indicates a typical relationship between temperature of the DUT and time during monitoring.

FIG. 7A illustrates an exemplary curve 701 that indicates a typical relationship between temperature of the DUT and time during monitoring. As noted above, the DUT is heated above the target temperature Temp1. Because of the exponential nature of the temperature decay (i.e. the chip temperature changes most quickly immediately after the large "heating" current source is turned off), forward voltage measurement should be initiated soon (e.g. on the order of several milliseconds) after cooling begins.

Figure 7B:
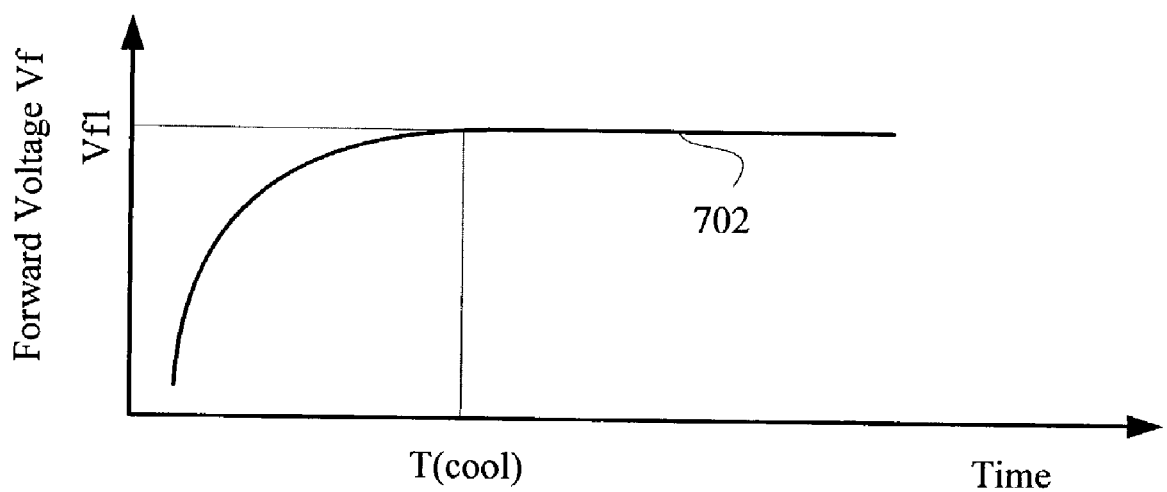
FIG. 7B illustrates an exemplary curve that indicates a typical relationship between the forward voltage Vf and time during monitoring when heating with focused light source.

FIG. 7B illustrates an exemplary curve 702 that indicates a typical relationship between the forward voltage Vf and time during monitoring of importance, the forward voltage Vf can be monitored using any standard measurement device (see measurement device 405 in FIG. 4A). In accordance with one feature of the invention, when the forward voltage Vf1 is detected, a temperature Temp1 (FIG. 7A) in the DUT is attained.

Figure 8:
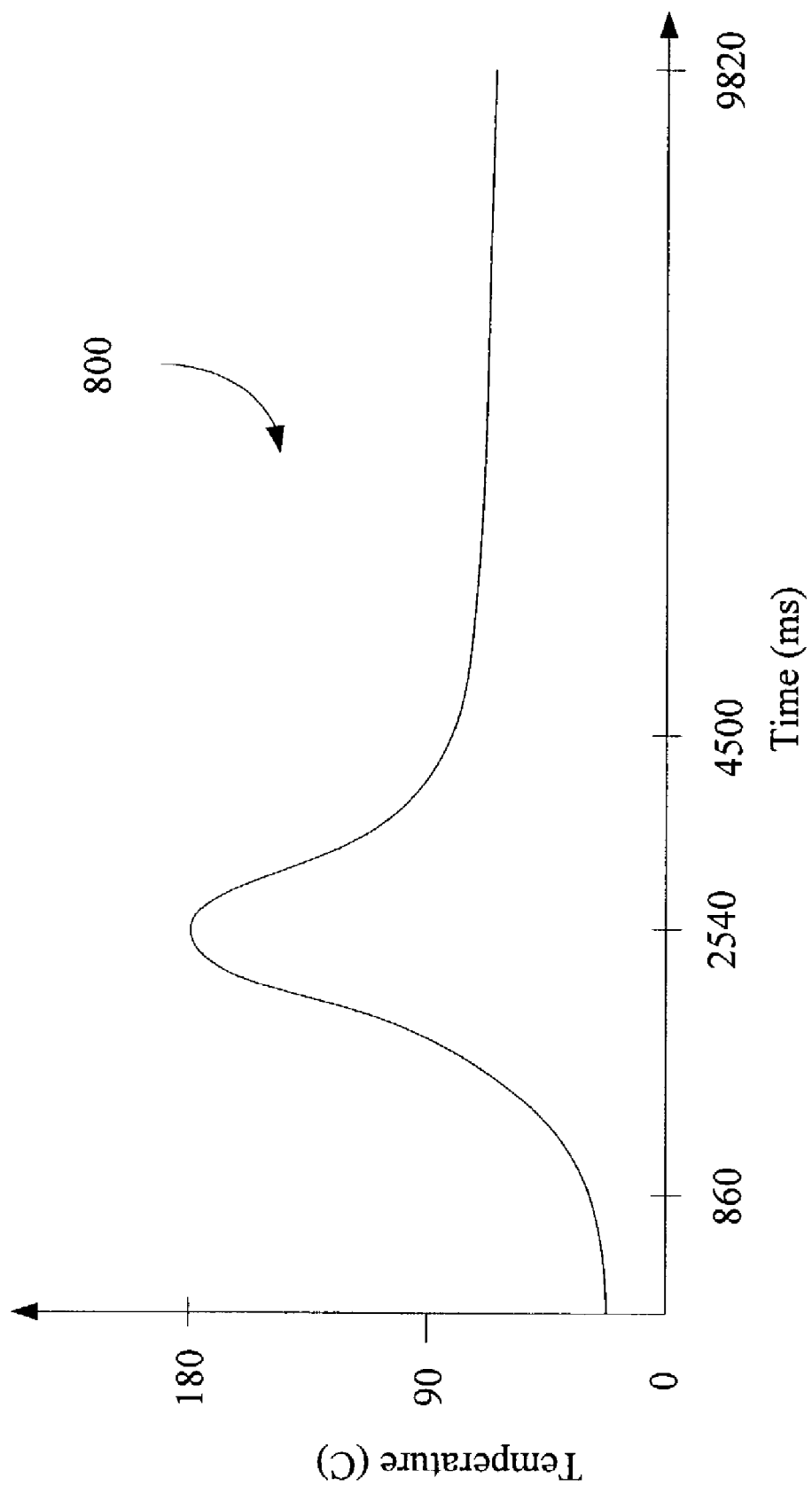
FIG. 8 illustrates an exemplary graph showing temperature versus time for one DUT during a heat cycle and subsequent cool (i.e. monitoring) cycle.

FIG. 8 illustrates an exemplary graph 800 showing temperature versus time for one DUT during a heat cycle and subsequent cool (i.e. monitoring) cycle. In this embodiment, the peak temperature, i.e. 180 C, is the curing temperature for the packaging of the DUT. Note that a curing period is typically at least several minutes whereas the heat cycle is less than three seconds. In accordance with one feature of the invention, this short heat cycle can cause the chip of the DUT to heat to the peak temperature without necessarily heating the molding compound adjacent the chip to the same temperature.

Advantageously, the substrate diode heating of the DUT can be implemented in software. In other words, no additional hardware is needed in a standard handler to implement high temperature testing. In one embodiment, the IR spot heater can be used in combination with the voltage/temperature measurement technique (specifically, steps 301 and 303–304 in FIG. 3), thereby allowing an accurate determination of test results under high temperature conditions.

Although illustrative embodiments of the invention have been described in detail herein with reference to the figures, it is to be understood that the invention is not limited to those precise embodiments. They are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A method of testing a device under high temperature conditions, the method comprising:
providing a forward bias to a substrate diode in the device using a first current that heats the device past a predetermined temperature;
replacing the first current with a second nominal current to maintain the forward bias;
monitoring a forward voltage of the substrate diode until the predetermined temperature is reached; and
testing the device at the predetermined temperature.

2. The method of claim 1, wherein monitoring the forward voltage includes correlating a predetermined forward voltage with the predetermined temperature.

3. The method of claim 2, wherein monitoring the forward voltage includes receiving a characterization that correlates the predetermined forward voltage to the predetermined temperature.

4. The method of claim 1, wherein providing a forward bias includes correlating a predetermined forward voltage with the predetermined temperature.

5. The method of claim 4, wherein providing a forward bias includes receiving a characterization that correlates the predetermined forward voltage to the predetermined temperature.

6. A method of testing a device, the method comprising:
providing a forward bias to a substrate diode in the device using a first current;
monitoring a forward voltage of the substrate diode by using a second current until a predetermined forward voltage is reached, wherein the second current is relatively small compared to the first current; and
testing the device at the predetermined voltage, wherein the predetermined voltage indicates a desired temperature for testing.

7. A method of testing a heated device, the method comprising:
providing a forward bias to a substrate diode in the heated device using a nominal current;
monitoring a forward voltage of the substrate diode until a predetermined forward voltage is reached; and
testing the device at the predetermined voltage, wherein the predetermined voltage indicates a desired temperature for testing, wherein monitoring the forward voltage includes correlating the predetermined forward voltage with the predetermined temperature.

8. The method of claim 7, wherein monitoring the forward voltage includes receiving a characterization that correlates the predetermined forward voltage to the predetermined temperature.

9. A computer-readable medium including computer software for testing a semiconductor device, the computer software comprising:
code for providing a forward bias to a substrate diode in the semiconductor device using a nominal current;
code for cooling the semiconductor device and monitoring a forward voltage of the substrate diode until a predetermined forward voltage is reached; and
code for testing the device at the predetermined voltage, wherein the predetermined voltage indicates a desired temperature for testing.

10. A computer-readable medium including computer software for testing a semiconductor device, the computer software comprising:
code for providing a forward bias to a substrate diode in the semiconductor device using a first current;
code for monitoring a forward voltage of the substrate diode until a predetermined forward voltage is reached; and
code for testing the semiconductor device at the predetermined voltage, wherein the predetermined voltage indicates a desired temperature for testing, wherein the code for monitoring the forward voltage includes code for correlating the predetermined forward voltage with the predetermined temperature.

11. A computer-readable medium including computer software for testing a semiconductor device, the computer software comprising:
code for providing a forward bias to a substrate diode in the semiconductor device using a first current;
code for monitoring a forward voltage of the substrate diode until a predetermined forward voltage is reached; and
code for testing the semiconductor device at the predetermined voltage, wherein the predetermined voltage indicates a desired temperature for testing, wherein the code for monitoring the forward voltage includes code for receiving a characterization that correlates the predetermined forward voltage to the predetermined temperature.

* * * * *